United States Patent
Kim et al.

(10) Patent No.: US 9,270,267 B2
(45) Date of Patent: Feb. 23, 2016

(54) TOUCH PANEL AND METHOD OF MANUFACTURING THE SAME

(71) Applicant: DONGBU HITEK CO., LTD., Seoul (KR)

(72) Inventors: Han-Kyung Kim, Bucheon-si (KR); Hyun Song, Suwon-si (KR); Young-Wook Kim, Seoul (KR); Won-Cheol Hong, Seoul (KR); Joon Song, Seoul (KR); Ae-Young Ma, Gunsan-si (KR); Jong-Hwan Ko, Gwangmyeong-si (KR); Jin-Ah Lee, Incheon (KR)

(73) Assignee: Dongbu HiTek Co., Ltd., Seoul (KR)

( * ) Notice: Subject to any disclaimer, the term of this patent is extended or adjusted under 35 U.S.C. 154(b) by 43 days.

(21) Appl. No.: 14/207,189

(22) Filed: Mar. 12, 2014

(65) Prior Publication Data

US 2015/0122623 A1 May 7, 2015

(30) Foreign Application Priority Data

Nov. 4, 2013 (KR) ........................ 10-2013-0132767

(51) Int. Cl.
*H03K 17/975* (2006.01)
*H03K 17/96* (2006.01)
(Continued)

(52) U.S. Cl.
CPC .............. *H03K 17/9618* (2013.01); *G02F 1/00* (2013.01); *G06F 3/044* (2013.01); *G06F 3/0412* (2013.01); *H01L 21/00* (2013.01); *H03K 2017/9613* (2013.01); *H03K 2217/96015* (2013.01)

(58) Field of Classification Search
CPC ....... G06F 3/041; G06F 3/0488; G06F 3/044; G06F 3/045; H05K 1/02; H05K 1/0298; H05K 1/09
USPC ........................................... 200/600; 345/173
See application file for complete search history.

(56) References Cited

U.S. PATENT DOCUMENTS 7,414,313 B2 8/2008 Majumdar et al.
7,439,962 B2 * 10/2008 Reynolds et al. ............. 345/173
(Continued)

FOREIGN PATENT DOCUMENTS

KR 10-2015-0049483 A 5/2015
WO 2012-099394 A2 7/2012

OTHER PUBLICATIONS

International Search Report and Written Opinion of International Searching Authority dated Jan. 29, 2015 for International Application No. PCT/KR2014/010472; 8 pgs.
(Continued)

*Primary Examiner* — Vanessa Girardi
(74) *Attorney, Agent, or Firm* — Andrew D. Fortney; Central California IP Group, P.C.

(57) ABSTRACT

A touch panel includes a transparent substrate, a first pattern/layer on the transparent substrate, and an second pattern/layer on or under the first pattern/layer. The first pattern/layer includes first electrodes detecting a first coordinate value and first metal interconnections connecting the first electrodes to a flexible printed circuit board (FPCB). The second pattern/layer includes second electrodes detecting a second coordinate value and second metal interconnections connecting the second electrodes to the FPCB. The first and second metal interconnections extend on side and back surfaces of the transparent electrode. Therefore, the metal interconnections connect the first and second patterns/layers to the FPCB by being formed on the side and back surfaces of the transparent substrate, which reduces the length and/or width of the bezel (a non-active region).

18 Claims, 7 Drawing Sheets

(51) Int. Cl.
*G06F 3/044* (2006.01)
*G02F 1/00* (2006.01)
*G06F 3/041* (2006.01)
*H01L 21/00* (2006.01)

(56) References Cited

U.S. PATENT DOCUMENTS

| | | | |
|---|---|---|---|
| 7,499,038 B2 | 3/2009 | Nishikawa et al. | |
| 8,026,903 B2* | 9/2011 | Hamblin et al. | 345/173 |
| 8,259,078 B2* | 9/2012 | Hotelling et al. | 345/173 |
| 8,477,105 B2 | 7/2013 | Haga et al. | |
| 8,659,573 B2 | 2/2014 | Haga et al. | |
| 8,803,838 B2 | 8/2014 | Haga et al. | |
| 2003/0095111 A1* | 5/2003 | Song et al. | 345/173 |
| 2006/0066590 A1 | 3/2006 | Ozawa et al. | |
| 2006/0131703 A1 | 6/2006 | Majumdar et al. | |
| 2006/0132465 A1 | 6/2006 | Nishikawa et al. | |
| 2010/0013791 A1 | 1/2010 | Haga et al. | |
| 2012/0319966 A1* | 12/2012 | Reynolds | 345/173 |
| 2013/0285986 A1 | 10/2013 | Haga et al. | |
| 2014/0022467 A1 | 1/2014 | Chai et al. | |
| 2014/0125616 A1 | 5/2014 | Haga et al. | |

OTHER PUBLICATIONS

Office Action dated Jul. 10, 2015, for Korean Patent Application No. 10-2013-0132767; 4 pgs.; Korean Intellectual Property Office, Republic of Korea.
Dai Kyu Choi; "Single Touch Screen Device Having Multi Connection Channel and Manufacturing Method Thereof"; Abstract of Korean Publication No. 1020150049483 A; Publication Date: May 8, 2015; http//kpa.kipris.or.kr.

* cited by examiner (Background Art)

(Background Art)

US 9,270,267 B2

TOUCH PANEL AND METHOD OF MANUFACTURING THE SAME

CROSS-REFERENCE TO RELATED APPLICATIONS

This application claims under 35 U.S.C. §119 to Korean Patent Application No. 10-2013-0132767, filed Nov. 4, 2013, which is hereby incorporated by reference.

BACKGROUND

The present disclosure relates to a touch panel and a method for manufacturing the same.

As computers using digital technologies are developing, computer-assisted devices are being developed. Personal computers, portable transmission devices, and other personalized information processing devices perform text and graphic processing using various input devices such as a keyboard, a mouse, and the like.

However, as an information-oriented society rapidly advances, the scope and use of computers are expanding. Thus, it may be difficult to efficiently drive new product development by using only the keyboard and mouse as input devices. Thus, a need for devices having a simple structure, low malfunction rate, and an easy-to-input information function is increasing.

Technologies for input devices are improving reliability and durability, and focus on innovation, design, processing-related technologies, and the like, beyond general functionality. For this, touch panels have been developed as input devices that are capable of inputting information such as text, graphics, menu selection, and the like.

Such a touch panel may be installed on a display surface of a flat panel display device such as an electronic organizer, a liquid crystal display device (LCD), a plasma display panel (PDP), an electroluminescence (E1) device, and the like, and an image display device such as a cathode ray tube (CRT), to allow an user to select desired information while seeing the image display device. The touch panels may be classified into a resistive type touch panel, a capacitive type touch panel, an electro-magnetic type touch panel, a surface acoustic wave (SAW) type touch panel, and an infrared type touch panel. The various types of touch panels are adopted for electronics, taking into consideration limitations on signal amplification, resolution differences, difficulty of design and processing, optical quality and/or characteristics, electrical quality and/or characteristics, mechanical quality and/or characteristics, environmental concerns, input characteristics, durability, and economic feasibility. These days, the resistive type and capacitive type touch panels are being widely used in various fields.

The capacitive touch panel includes an add-on type touch panel and a cover glass-integrated or display-integrated touch panel using a lamination structure. The add-on type touch panel includes GFF, GF2, GG, and the like, and the cover glass-integrated touch panel includes G1F, G2, and the like.

GFF may be the most common touch panel having a structure in which two PET films or two parts of a PET film on which Rx (e.g., signal reception) patterns for detecting an X-axis coordinate value are laminated in the form of a thin film, and a PET film on which Tx (e.g., signal transmission) patterns for detecting a Y-axis coordinate value are laminated in the form of a thin film, are laminated or layered on a bottom surface of a cover glass.

The GF2 has a structure in which the Rx and Tx patterns are respectively deposited in the form of a thin film on top and bottom surfaces of the PET film, and then, the PET film is laminated or layered on the bottom surface of the cover glass. The GG has a structure in which the Rx and Tx patterns are respectively deposited in the form of a thin film on top and bottom surfaces of a transparent substrate formed of glass instead of an ITO film, and then the transparent substrate is laminated or layered the bottom surface of the cover glass.

The add-on type GFF is the most common type touch panel. However, in recent years, demands for mobile phones having a large screen and a small size are increasing with an increase of utilization of the mobile phones. Thus, a development process with respect to the cover glass-integrated and display-integrated touch panels has become an issue.

Generally, when the screen increases, the pattern layer(s) in the active region of the touch panel increase, and thus, a bezel that corresponds to the non-active region of the touch panel or touch screen may also increase in width. As a result, the development process for realizing slim electronic devices having a large screen may be limited.

FIG. 1 is a schematic plan view of a touch panel according to a related art, and FIG. 2 is a plan view illustrating Tx and Rx pattern layers in FIG. 1.

Referring to FIGS. 1 and 2, a touch screen panel 100 according to the related art includes a transparent substrate 101 formed of a general film or glass, a Tx pattern layer 130 deposited in the form of a thin film on a top surface of the transparent substrate 101, and a Rx pattern layer 120 deposited in the form of a thin film on a top surface of the Tx pattern layer 130. The Tx pattern layer 130 includes a plurality of Tx electrodes 107 detecting a Y-axis coordinate value and a Tx metal interconnection 103 connected to an end of each Tx electrode 107 to transmit an electrical signal to a flexible printed circuit board (FPCB) 300. The Rx pattern layer 120 includes a plurality of Rx electrodes 122 detecting an X-axis coordinate value and an Rx metal interconnection 110 connected to an end of each Rx electrode 122 to transmit an electrical signal to the FPCB 300.

The plurality of Rx and Tx electrodes 122 and 107 are disposed on the transparent substrate 101 in a lattice shape to form an active region, and the metal interconnections 110 and 103 are disposed to one side of the electrodes 122 and 107 to respectively correspond to the electrodes 122 and 107 and form a bezel region.

As shown in FIGS. 1 and 2, the Tx metal interconnection 103 in the bezel region may correspond to the Tx electrode 107 to transmit the electrical signal of the Tx electrode 107 to the FPCB 300. Therefore, according to properties in the panel structure, the more Tx electrodes 107 that are present, the more Tx metal interconnections 103 there are, increasing the width of the bezel on each of the left and right sides of the transparent substrate 101 on which the Tx electrodes 107 is laminated.

In devices such as smart phones including a touch screen, a display or a region touchable by a user may be maximally utilized by reducing the bezel region. However, reduction of a trace line region such as the metal interconnection reaches its limit due to limitations in the processing technologies. Also, when the trace lines are on both left and right sides of the touch panel, panel characteristics may be non-uniform due to differences in the delay of a driving signal, depending on the direction of the trace line.

SUMMARY

Embodiments of the present disclosure provide a touch panel in which a metal interconnections connected to Tx and Rx electrodes are on side and back surfaces of a display unit, thereby reducing the width of the bezel (or making more efficient use of the bezel width) and increasing the active region of the touch panel or touch screen.

In one embodiment, a touch panel includes a transparent substrate comprising a film and glass; a first electrode (e.g., Tx) pattern and/or layer on a top surface of the transparent substrate; and a second electrode (e.g., Rx) pattern and/or layer on a top or bottom surface of the first electrode pattern and/or layer, wherein the first electrode pattern and/or layer includes a plurality of first electrodes detecting a first (e.g., Y-axis) coordinate value and a plurality of first (e.g., Tx) metal interconnections connecting the first electrodes to a flexible printed circuit board (FPCB), the second electrode pattern and/or layer includes a plurality of second (e.g., Rx) electrodes detecting a second (e.g., X-axis) coordinate value and a plurality of second (e.g., Rx) metal interconnections connecting the second electrodes to the FPCB; and each first metal interconnection is connected to an end of a corresponding first electrode and is formed, routed or placed on side and back surfaces of the transparent substrate, and each second metal interconnection is connected to an end of a corresponding second electrode and is formed, routed or placed on side and back surfaces of the transparent substrate. In at least one embodiment, the first metal interconnection is formed, routed or placed on a first side surface and in a first region on the back surface of the transparent substrate, and each second metal interconnection is formed, routed or placed on a second side surface and in a second region on the back surfaces of the transparent substrate.

The details of one or more embodiments are set forth in the accompanying drawings and the description below. Other features will be apparent from the description and drawings, and from the claims.

DETAILED DESCRIPTION OF THE EMBODIMENTS

Hereinafter, reference will now be made in detail to embodiments, examples of which are illustrated in the accompanying drawings. However, the embodiments are not limited thereto. In the descriptions of various embodiments, detailed descriptions related to well-known functions or configurations may be omitted in order not to unnecessarily obscure subject matter of the embodiment.

Figure 1:
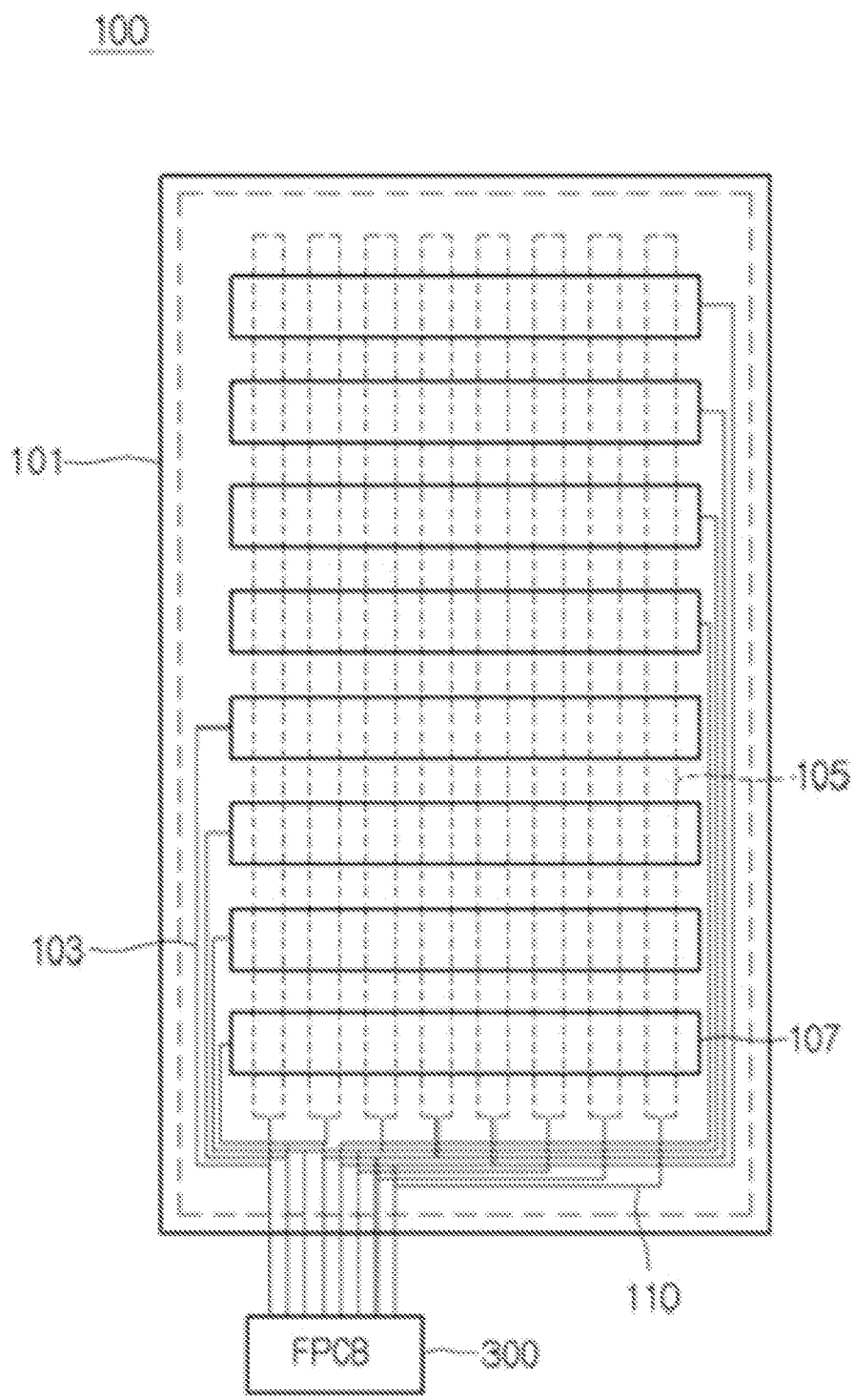
FIG. 1 is a schematic plan view of a touch panel according to a related art.
Figure 2:
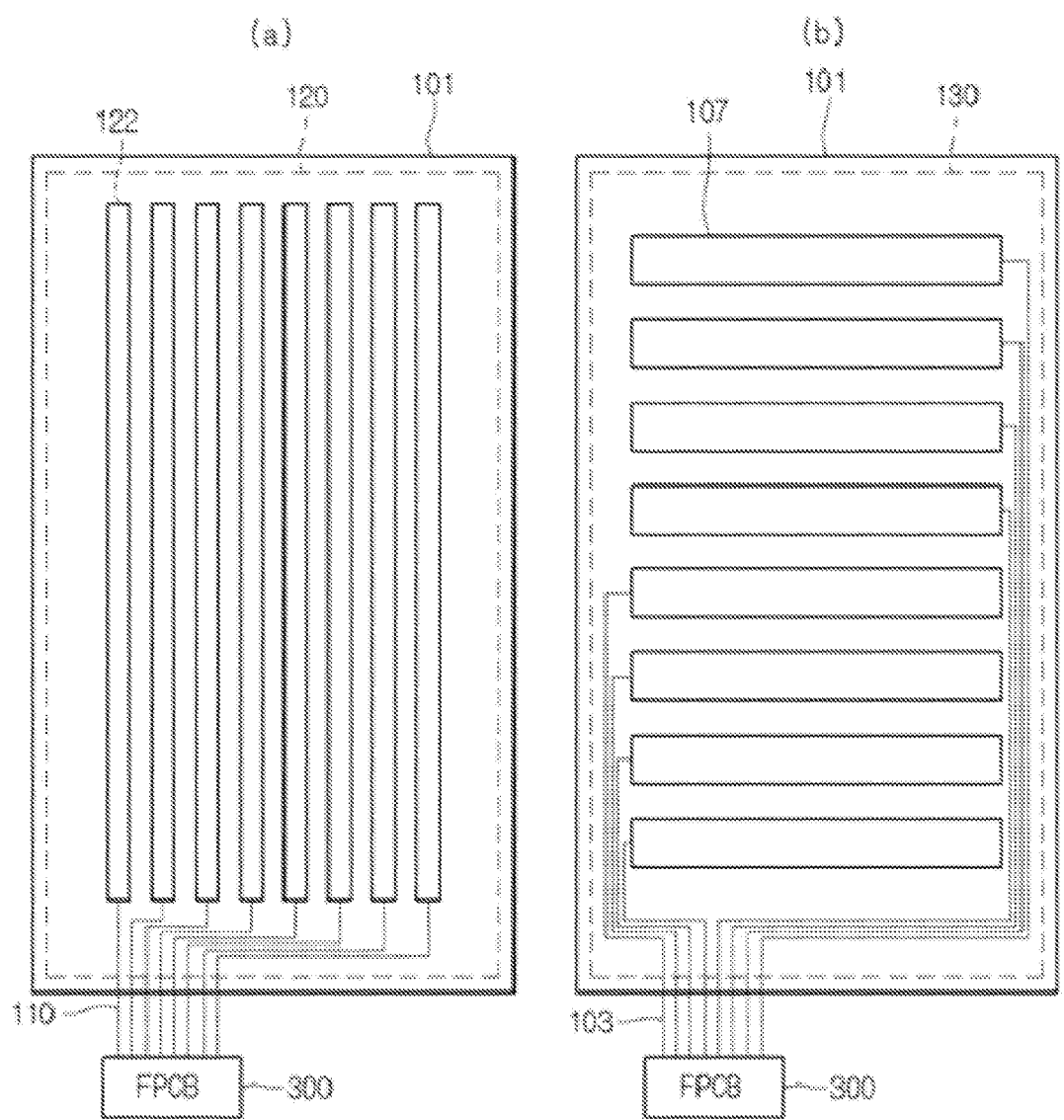
FIG. 2 is a plan view illustrating Tx and Rx pattern layers of FIG. 1.
Figure 3:
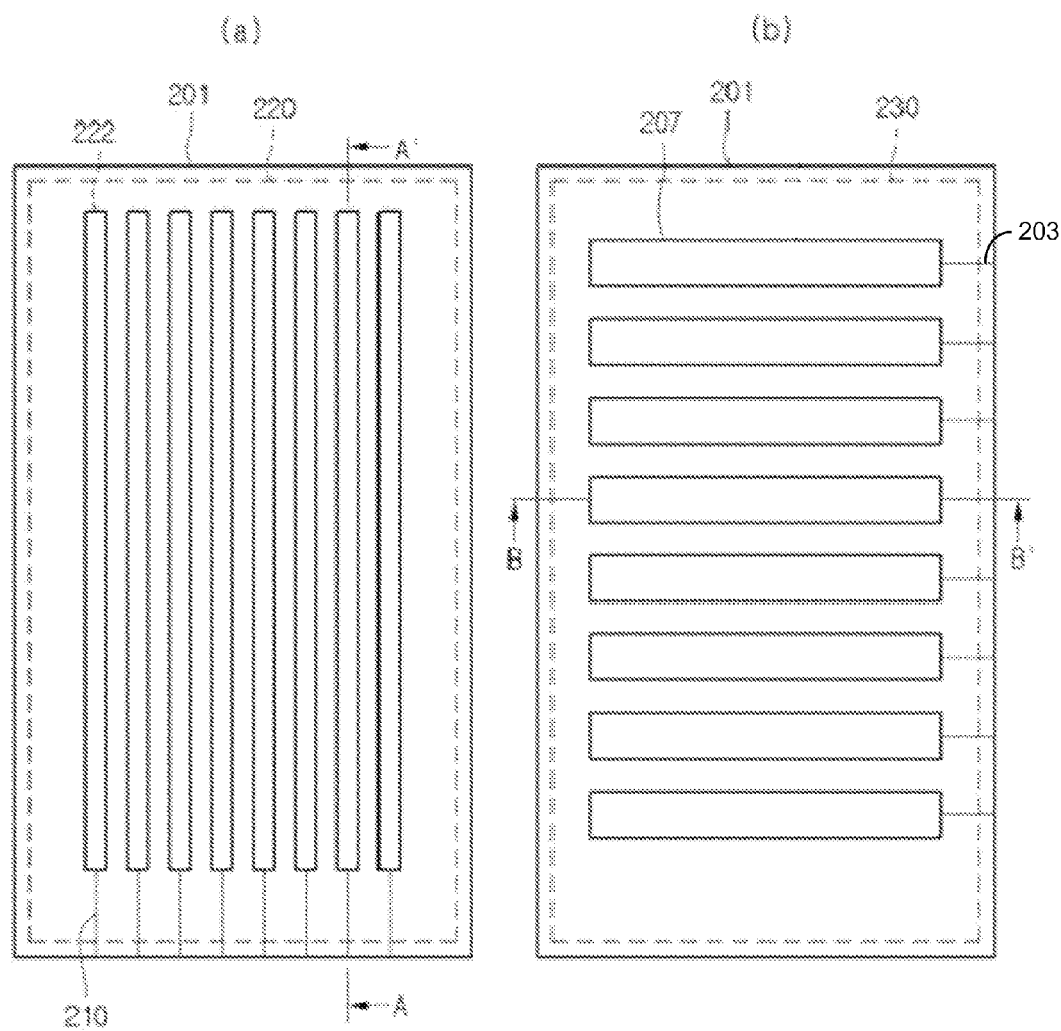
FIG. 3 is a plan view illustrating Tx and Rx pattern layers according to an embodiment of the present disclosure.
Figure 4:
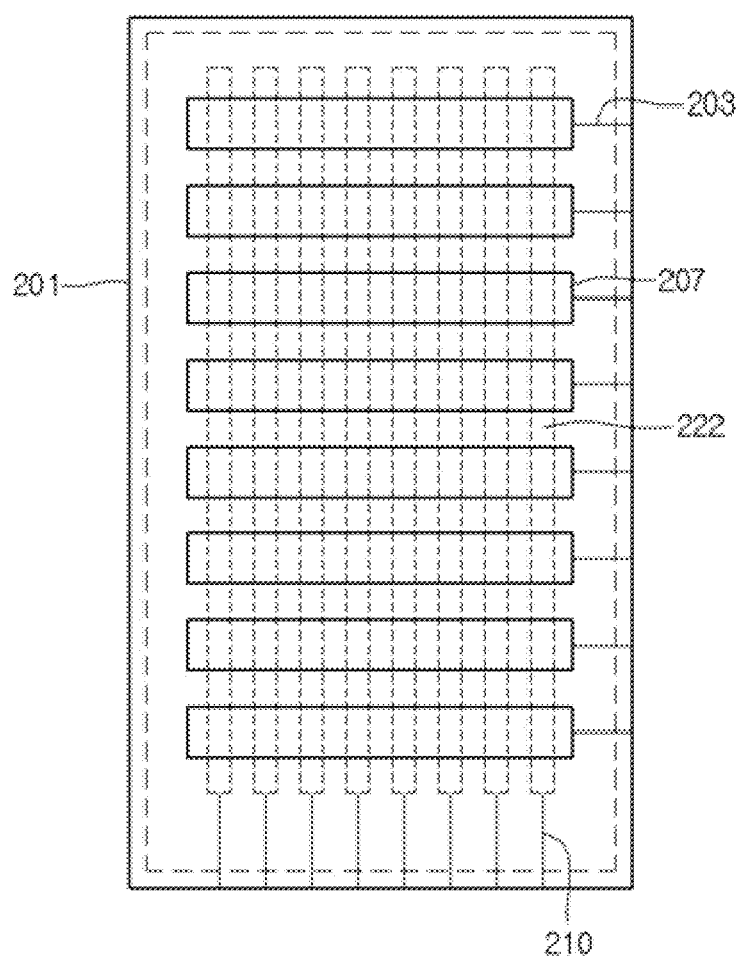
FIG. 4 is a schematic plan view of a touch panel according to an embodiment of the present disclosure.

FIG. 3 is a plan view illustrating Tx and Rx pattern layers according to an embodiment of the present disclosure, and FIG. 4 is a schematic plan view of a touch panel according to an embodiment of the present disclosure.

Referring to FIGS. 3 and 4, an exemplary touch panel or touch screen 200 includes a transparent substrate 201, a Tx pattern layer 230 deposited in the form of (or comprising) a thin film on a top surface of the transparent substrate 201, and an Rx pattern layer 220 deposited in the form of (or comprising) a thin film on a bottom surface (e.g., under) or on a top surface of (e.g., over) the Tx pattern layer 230, and Tx and Rx metal interconnections 203 and 210, respectively connected to ends of the Tx and Rx pattern layers 230 and 220.

The transparent substrate 201 serves as a base of the touch panel. Since the transparent substrate 201 is mounted on a top surface of a display unit of an electronic device, the transparent substrate 201 may have a size corresponding to and/or be manufactured according to the size of the display unit, and comprise a material having excellent light transmissivity (e.g., transparency to visible light), such as a glass, a polyethylene terephthalate (PET) or polycarbonate film or sheet, and the like.

The touch panel according to one or more embodiments may detect a user's touch and convert the touch into an electrical signal transmitted to a flexible printed circuit board (FPCB). Therefore, it will be understood that the term 'connect' in this specification includes an electrical connection. Also, the terms 'left side', 'right side', 'top' and 'upper', and 'bottom' and 'lower' disclosed in the specification are arbitrarily used in the drawings, and thus the left side may be changed into the right side and vice versa as necessary or desired, and/or depending on the viewer's perspective.

The Tx pattern layer 230 includes a plurality of Tx electrodes 207 and the Tx metal interconnections 203 connecting the end of each Tx electrode 207 to the FPCB 300. The Rx pattern layer 220 includes a plurality of Rx electrodes 222 and the Rx metal interconnections 210 connecting the end of each Rx electrode 222 to the FPCB 300.

Each of the Tx and Rx pattern layers 230 and 220 and/or the substrate 201 may be divided into an active region and a non-active region (bezel region) according to a function thereof. The active region may represent a region in which a user's touch may be detected and converted into an electrical signal (e.g., a central portion of the substrate and/or each of patterns and/or layers including the Tx and Rx electrodes 207 and 222). The bezel region may represent a peripheral region of the substrate 201 and/or a peripheral region that does not include the electrodes 207 and 222 (e.g., a portion outside the pattern and/or layer).

Each of the Tx electrodes 207 of the Tx pattern and/or layer 230 has a transversal and/or bar shape. Also, the Tx electrodes 207 are spaced a predetermined distance from each other in a first (e.g., Y-axis) direction to detect a coordinate value along a first (e.g., the Y-axis) direction. Each of the Rx electrodes 222 of the Rx pattern and/or layer 220 has a longitudinal and/or bar shape. Also, the Rx electrodes 222 are spaced a predetermined distance from each other in a second (e.g., an X-axis) direction to detect a coordinate value along a second (e.g., the X-axis) direction. All of the Tx and Rx electrodes 207 and 222 may be in the active region to detect the coordinate values in the active region receiving the user's touch and convert the coordinate values into electrical signals. The Tx and Rx electrodes 207 and 222 may comprise a material having excellent light transmissivity and electrical conductivity, such as indium tin oxide (ITO) and the like.

The Tx metal interconnections 203 of the Tx pattern and/or layer 230 may have an end electrically connected to a unique one of the Tx electrodes 207 (e.g., at a left or right side of the Tx pattern and/or layer 230) and may extend towards a side surface of the transparent substrate 201 and/or up to a lower portion of the transparent substrate 201. The Rx metal interconnections 210 of the Rx pattern and/or layer 220 may have an end connected to a unique one of the Rx electrodes 222 (e.g., at an upper or lower portion of the Rx electrode 222) and may extend towards the same or different side surface of the transparent substrate 201 as the Tx metal interconnections 203, optionally up to the lower portion of the transparent substrate 201. Thus, the metal interconnections 203 and 201 may extend to a back surface of the transparent substrate 201, and therefore, the FPCB may be on or at a predetermined position on the back surface of the transparent substrate 201.

That is, according to the related art, the plurality of Tx metal interconnections 203 connected to the plurality of the Tx electrodes 207 are entirely disposed in the bezel region on the upper portion or surface of the transparent substrate 201, and the patterned Tx metal interconnections 203 are in a single region. However, according to one or more embodiments of the present disclosure, since the Tx metal interconnection 203 passes along and/or wraps around the side surface of the transparent substrate and is on the back surface of the transparent substrate, the width of the Tx electrodes 207 may extend in the direction of the long axis of the electrodes 207 (e.g., the X-axis direction) to reduce the width of the bezel region, increase the width of the active region, and/or increase the efficient use of the bezel region. This may be applied equally to the Rx electrodes 222 perpendicular to the Tx electrodes 207, and thus a length of the Rx electrodes 222 may increase in the direction of the long axis of the electrodes 222 (e.g., the Y-axis direction) to increase the scope and/or area of the active region on the whole.

Also, each of the Tx metal interconnections 203 may extend in only one direction (e.g., towards the left or right side) of the Tx electrodes 207, and also each of the Rx metal interconnections 210 may extend in only one direction (e.g., towards the upper or lower side) of the Rx electrodes 222. Such embodiments may realize the metal interconnection in only one direction to secure uniform panel characteristics, as well as reduce the width of the bezel.

Figure 5:
FIG. 5 is a cross-sectional view of a transparent substrate of an embodiment of the present disclosure.
Figure 6:
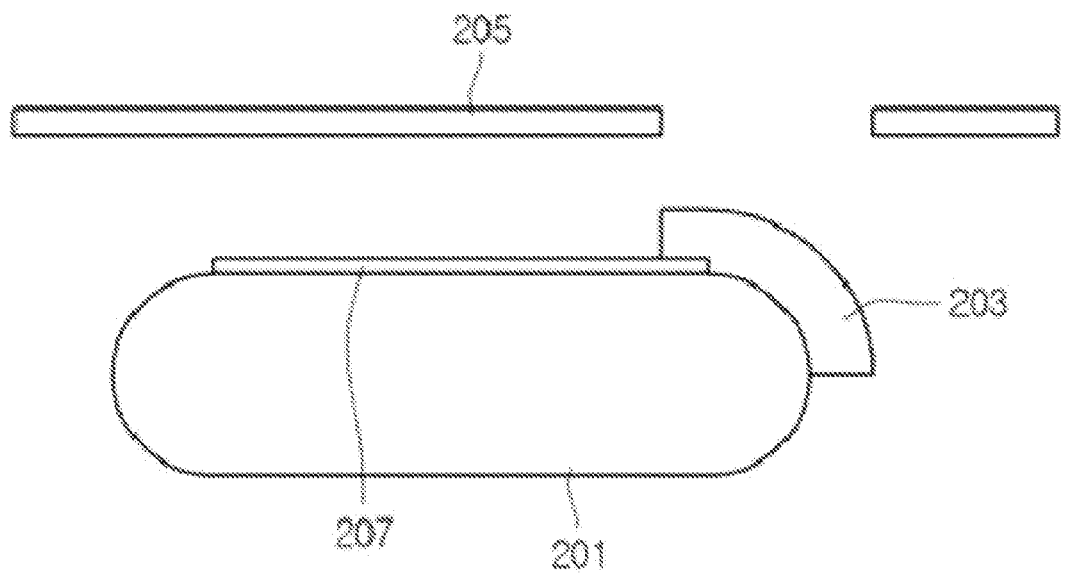
FIGS. 6 to 7 are cross-sectional views taken alone line A-A' of FIG. 3 and illustrate an exemplary method of forming a metal interconnection.
Figure 7:
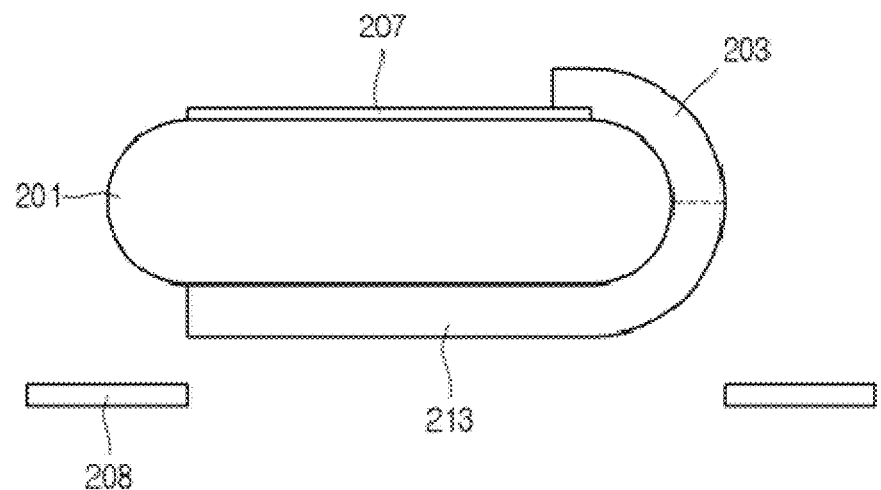
Figure 8:
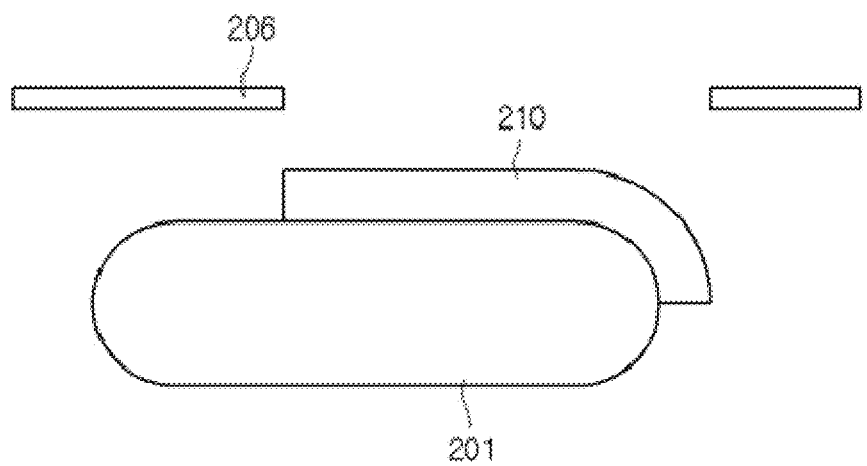
FIGS. 8 to 9 are cross-sectional views taken alone line B-B' of FIG. 3 and illustrate an exemplary method of forming a metal interconnection.
Figure 9:
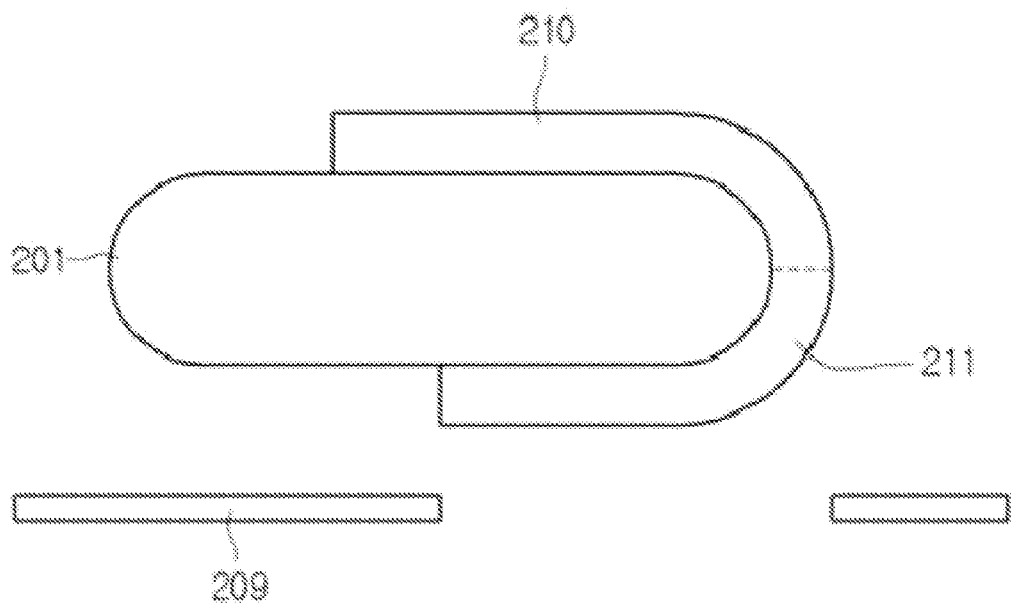

FIG. 5 is a cross-sectional view of a transparent substrate of an embodiment of the present disclosure, FIGS. 6 to 7 are cross-sectional views taken alone line A-A' of FIG. 3 and illustrate an exemplary method of forming a metal interconnection, and FIGS. 8 to 9 are cross-sectional views taken alone line B-B' of FIG. 3 and illustrate an exemplary method of forming a metal interconnection. Hereinafter, a method of forming the Tx and Rx metal interconnections 203 and 210 in the touch panel or touch screen of one or more embodiments of the present disclosure will described below in detail.

FIG. 5 is a cross-section of the transparent substrate 201. Here, the cross-section may be a cross-section along the width (e.g., in the X-axis direction) or along the length (e.g., in the Y-axis direction). As shown in FIG. 5, the transparent substrate 201 may include a first glass plate 202 on the bottom, a back substrate 212 on a top surface of the first glass plate 202, and a second glass plate 213 on a top surface of the back substrate 212.

In detail, the back substrate 212 may be a thin film transistor (TFT) array substrate on which TFTs are arranged. The TFT is a switching device which transmits or blocks a signal to a liquid crystal. The TFT may perform a switching operation for closing or opening current flow between data electrodes through a gate according to a supplied voltage. The back substrate 212 may be a substrate on which a gate electrode, an insulation film, a semiconductor film, a data electrode, a protection film, and a pixel electrode are deposited and patterned in predetermined shapes.

Also, the second glass plate 213 on the top surface of the back surface substrate 212 may comprise a filter substrate. A color filter may include three or more different dyes or pigments, each having one of at least three basic colors, divided by a black matrix. Deposition and patterning processes may be performed on the glass plate 213 by a first processing unit that forms the black matrix and a second processing unit to form the color filter(s).

A liquid crystal process forms a plurality of liquid crystal cells between the TFT array substrate and the color filter substrate (e.g., on one of the TFT array substrate and the color filter substrate) to couple the TFT array substrate to the color filter substrate, thereby forming the transparent substrate 201.

After the transparent substrate 201 which plays a part of a display device is formed, one or more edges along one or more of the side surfaces of the transparent substrate 201 may be ground to a convex shape so that the transparent substrate 201 (or an edge or side surface thereof) has a predetermined curvature. The processing may be performed to facilitate depositing metal for the metal interconnection on the transparent substrate 201, and particularly, to facilitate depositing metal on the side surface of the transparent substrate 201.

Referring to FIGS. 6 to 7, the Tx electrodes 207 may be formed on a top surface of the transparent substrate 201, and then a mask 205 having an opening in a predetermined region may be placed on or above the transparent substrate 201 to form the Tx metal interconnections 203 connected to ends of the Tx electrodes 207. More specifically, the Tx metal interconnections 203 may be formed by depositing a metal (e.g., a paste or ink of silver, copper, gold, aluminum, nickel, zinc, particles thereof, alloys or compounds thereof, etc.) in a predetermined pattern (e.g., by screen printing) through the mask, then heating to form the electrodes. Also, a mask 208 having a larger opening may be placed under the transparent substrate 201 (or over the transparent substrate 201 if the transparent substrate 201 is turned over relative to the orientation shown in FIG. 7) to form Tx metal interconnections 213 connected to the Tx metal interconnections 203. The Tx metal interconnections 213 may be formed in a pattern in the same manner as the Tx metal interconnections 203.

The back surface Tx metal interconnection 213 may have a length depending on the position of the FPCB on the back surface of the transparent substrate 201. The FPCB contacts the back surface Tx metal interconnection 213. If the FPCB is formed on the transparent substrate 201 (e.g., in the lower region) adjacent to the Tx metal interconnections 213, each of the back surface Tx metal interconnections 213 may include a bonding pad 250 to be connected to the FPCB. A dielectric or insulating layer may be formed over the Tx electrodes 207 and, optionally part or all of the Tx metal interconnections 203, as is known in the art.

Referring to FIGS. 8 to 9, Rx electrodes (not shown) may be formed on an upper surface of the Tx pattern and/or layer (not shown) or on a dielectric or insulating layer on or over the Tx electrodes, and then a mask 206 having an opening in a predetermined region may be placed on or over the upper surface of the transparent substrate 201 to form the Rx metal interconnections 210 connected to ends of the Rx electrodes. Also, a mask 209 having an opening in a predetermined region may be placed on or over the lower portion of the transparent substrate 201 to form back surface Rx metal interconnections 211 connected to the Rx metal interconnections 210. The Rx metal interconnections 210-211 may be formed in a pattern in the same manner as the Tx metal interconnections 203.

The back surface Rx metal interconnections 211 may have a length depending on the position of the FPCB on the back surface of the transparent substrate 201. The FPCB contacts the back surface Rx metal interconnection 211. If the FPCB is on the transparent substrate 201 (e.g., the lower region of the transparent substrate 201) adjacent to the back surface Rx metal interconnections 211, each of the back surface Rx metal interconnections 211 may include a bonding pad 250 to be connected to the FPCB. In general, the back surface Tx metal interconnections 213 and the back surface Rx metal interconnections 211 are formed, patterned and/or placed in different and non-overlapping regions on the back surface of the transparent substrate 201.

Figure 10:
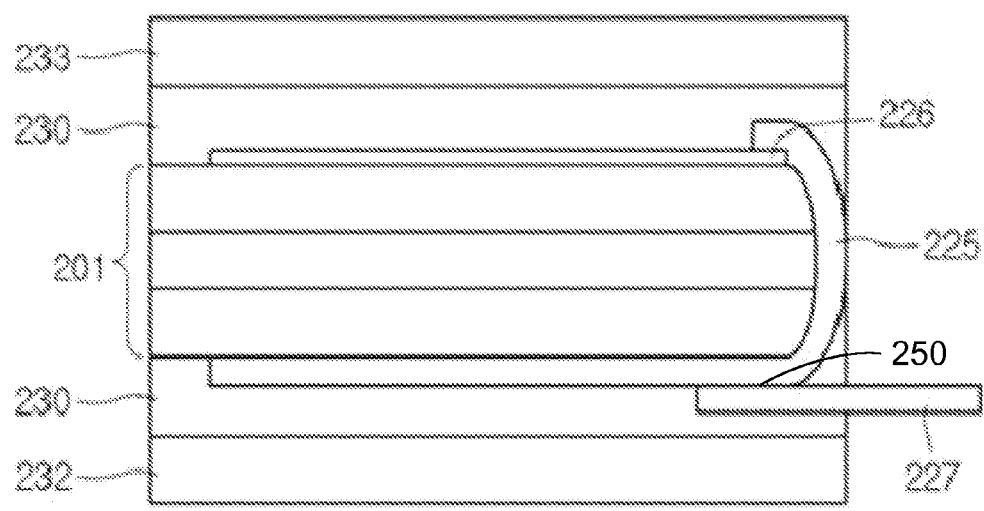
FIG. 10 is a cross-sectional view of a touch panel according to an embodiment of the present disclosure.

FIG. 10 is a cross-sectional view of a touch panel or touch screen according to an embodiment of the present disclosure.

Referring to FIG. 10, the exemplary touch panel may have a cell structure including a touch panel unit 226 including the Tx and Rx patterns and/or layers on the transparent substrate 201, formed on a glass and/or film substrate and performing one or more thin film processes (as described herein), a metal interconnection 225 contacting an end of the touch panel unit 226 and passing around the side surface of the transparent substrate 201 to the back surface of the transparent substrate 201, an optically clear adhesive (OCA) film 230 on each of the top and bottom surfaces of the transparent substrate 201, and polarizing films 233 and 232 respectively on the OCA films 230 (e.g., the uppermost and lowermost portions of the cell structure). An FPCB 227 may be attached or mounted on the plurality of metal interconnections 225 connected to the electrodes in the touch panel unit 226 to transmit an electrical signal. The FPCB 227 may be placed elsewhere on the bottom of the transparent substrate 201 (e.g., at the opposite end of the metal interconnections 225). Alternatively, if the FPCB 227 is in the location shown, the metal interconnections 225 in the direction shown (e.g., the Y-axis direction) may be much shorter (e.g., not extending beyond the edge of the FPCB 227 under the transparent substrate 201).

Therefore, in the touch panel according to one or more embodiments of the present disclosure, the metal interconnection connected to the electrode patterns and/or layers may be connected to the FPCB by passing or routing the metal interconnections on the side and back surfaces of the transparent substrate, and thus the length of the touch panel unit 226 may extend in the X-axis and/or Y-axis directions (e.g., have a greater length and/or width) and/or reduce the width of the bezel, which corresponds to a non-active region, thereby reducing the length and/or width of the electronic device.

As the bezel region is reduced in size (e.g., length and/or width), the product including the touch panel may be miniaturized or made smaller, and also the display region for displaying images may increase in size. Thus, embodiments of the present disclosure may be advantageous for manufacturing electronic devices having a large screen.

According to embodiments of the present disclosure, the metal interconnection connected to the Tx and Rx patterns and/or layers may be connected to the FPCB by forming and/or routing the metal interconnections on the side and back surfaces of the transparent substrate to reduce the width and/or length of the bezel, which corresponds to a non-active region.

In the related art, when the metal interconnection is formed, a fine pattern process is performed to reduce the width of the bezel region. However, according to embodiments of the present disclosure, the fine pattern process is not necessary and may be omitted to increase manufacturing yield and/or reduce manufacturing costs of the touch panel.

Also, the metal interconnections connected to the electrodes in an electrode pattern and/or layer of the touch panel may be realized in only one direction, which may provide and/or secure more uniform panel characteristics.

Any reference in this specification to "one embodiment," "an embodiment," "example embodiment," etc., means that a particular feature, structure, or characteristic described in connection with the embodiment is included in at least one embodiment of the invention. The appearance of such phrases in various places in the specification do not necessarily all refer to the same embodiment. Further, when a particular feature, structure, or characteristic is described in connection with any embodiment, it is within the purview of one skilled in the art to effect such feature, structure, or characteristic in connection with other embodiments.

What is claimed is:

1. A touch panel comprising:
    a transparent substrate comprising a film and glass;
    a first pattern and/or layer on a top surface of the transparent substrate; and
    a second pattern and/or layer on, over or under the first pattern and/or layer,
    wherein the first pattern and/or layer comprises a plurality of first electrodes detecting a first coordinate value or location and a plurality of first metal interconnections connecting the first electrodes to a flexible printed circuit board (FPCB),
    the second pattern layer comprises a plurality of second electrodes detecting a second coordinate value or location and a plurality of second metal interconnections connecting the second electrodes to the FPCB; and
    the first metal interconnections are connected to an end of each of the first electrodes and are on side and back surfaces of the transparent substrate, and the second metal interconnections are connected to an end of each of the second electrodes and are on the side and back surfaces of the transparent substrate.

2. The touch panel according to claim 1, wherein each of the second metal interconnections are connected to a same side or end of each of the second electrodes.

3. The touch panel according to claim 1, wherein the transparent substrate has one or more rounded side surfaces or edges.

4. The touch panel according to claim 3, wherein the one or more rounded side surfaces or edges has a predetermined curvature.

5. The touch panel according to claim 1, wherein each of the first metal interconnections are connected to a same side or end of each of the first electrodes.

6. The touch panel according to claim 5, wherein each of the second metal interconnections are connected to a same side or end of each of the second electrodes.

7. The touch panel according to claim 1, wherein the FPCB is attached to a predetermined position or location on the back surface of the transparent substrate.

8. The touch panel according to claim 7, wherein each of the first and second metal interconnections comprise a bonding pad in a region in or adjacent to the predetermined position or location of the FPCB.

9. The touch panel according to claim 1, wherein each of the first and second metal interconnections comprise a bonding pad.

10. The touch panel according to claim 9, wherein the bonding pads are in a region adjacent to the FPCB.

11. The touch panel according to claim 1, further comprising an optically clear adhesive (OCA) film on each of the top and bottom surfaces of the transparent substrate.

12. The touch panel according to claim 11, further comprising a polarized film on each of the OCA films.

13. The touch panel according to claim 1, wherein the first and second metal interconnections are respectively on top and back surfaces of the transparent substrate.

14. The touch panel according to claim 13, wherein the first and second metal interconnections are respectively on the top and side surfaces of the transparent substrate.

15. The touch panel according to claim 13, wherein the first and second metal interconnections are on back and side surfaces of the transparent substrate.

16. The touch panel according to claim 1, wherein the first coordinate value or location is along a Y or vertical axis of the touch panel.

17. The touch panel according to claim 16, wherein the second first coordinate value or location is along an X or horizontal axis of the touch panel.

18. The touch panel according to claim 17, wherein the first metal interconnections are on first side of the transparent substrate, and the second metal interconnections are on a second side of the transparent substrate.

\* \* \* \* \*